(12) United States Patent
Kim et al.

(10) Patent No.: US 8,552,505 B1
(45) Date of Patent: Oct. 8, 2013

(54) INTEGRATED CIRCUITS HAVING IMPROVED METAL GATE STRUCTURES AND METHODS FOR FABRICATING SAME

(75) Inventors: Hoon Kim, Guilderland, NY (US); Kisik Choi, Hopewell Junction, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/445,719

(22) Filed: Apr. 12, 2012

(51) Int. Cl.
*H01L 21/70* (2006.01)

(52) U.S. Cl.
USPC ..................... 257/369; 257/E27.06

(58) Field of Classification Search
USPC ............................. 257/369, E27.06
See application file for complete search history.

(56) References Cited

U.S. PATENT DOCUMENTS

| 2010/0059833 A1* | 3/2010 | Yu et al. ............... 257/410 |
| 2010/0087043 A1* | 4/2010 | Cheng et al. ............ 438/424 |
| 2012/0112290 A1* | 5/2012 | Utomo et al. ............ 257/369 |

\* cited by examiner

*Primary Examiner* — Julio J Maldonado
*Assistant Examiner* — Hajar Kolahdouzan
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes forming a PFET trench in a PFET region and an NFET trench in an NFET region of an interlayer dielectric material on a semiconductor surface. The NFET trench is partially filled with an N-type work function metal layer to define an inner cavity. The PFET trench and the inner cavity in the NFET trench are partially filled with a P-type work function metal layer to define a central void in each trench. In the method, the central voids are filled with a metal fill to form metal gate structures. A single recessing process is then performed to recess portions of each metal gate structure within each trench to form a recess in each trench above the respective metal gate structure.

20 Claims, 3 Drawing Sheets

US 8,552,505 B1

INTEGRATED CIRCUITS HAVING IMPROVED METAL GATE STRUCTURES AND METHODS FOR FABRICATING SAME

TECHNICAL FIELD

The present disclosure generally relates to integrated circuits and methods for fabricating integrated circuits, and more particularly relates to integrated circuits having improved metal gate structures and methods for fabricating integrated circuits with improved metal gate structures.

BACKGROUND

As technology nodes shrink, in some integrated circuit designs there has been a desire to eliminate use of polysilicon gate electrodes to improve device performance with decreased feature sizes. Replacing polysilicon gate structures with metal gate structures is one solution. Often, metal gate structures utilize aluminum in conjunction with cobalt in their metal fill portion. However, the use of aluminum and cobalt presents several technical challenges in smaller technology nodes. For example, aluminum/cobalt is difficult to recess when forming self-aligned contacts. Further, smaller technology nodes require the use of chemical vapor deposition (CVD) for proper deposition. Often, aluminum deposited by CVD suffers from voids within the metal gate structure. While voiding can occur when depositing a metal into any sized trench, it is particularly troublesome in small trenches. And, as gate lengths decrease the trenches also decrease in size. Depositing metal into the smaller trenches becomes increasingly difficult, and increasingly likely to form voids. Additionally, the use of cobalt in conventional metal gate structures typically causes an increase in resistance.

Accordingly, it is desirable to provide integrated circuits having improved metal gate structures and methods for fabricating integrated circuits having improved metal gate structures. In addition, it is desirable to provide integrated circuits and methods for fabricating integrated circuits which inhibit voiding in the metal gate structures. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes forming a PFET trench in a PFET region and an NFET trench in an NFET region of an interlayer dielectric material on a semiconductor surface. The NFET trench is partially filled with an N-type work function metal layer to define an inner cavity. The PFET trench and the inner cavity in the NFET trench are partially filled with a P-type work function metal layer to define a central void in each trench. In the method, the central voids are filled with a metal fill to form metal gate structures. A single recessing process is then performed to recess portions of each metal gate structure within each trench to form a recess in each trench above the respective metal gate structure.

In another embodiment, a method for fabricating an integrated circuit is provided and includes forming a trench in an interlayer dielectric material on a semiconductor surface. The method further includes partially filling the trench with tungsten nitride to define a central void. The central void is filled with tungsten to form a metal gate structure.

In accordance with another embodiment, an integrated circuit is provided and includes an interlayer dielectric material formed on a semiconductor surface with a PFET region defining a PFET trench and an NFET region defining an NFET trench. An N-type work function metal layer partially fills the NFET trench and defines an inner cavity. Further, a tungsten nitride layer partially fills the PFET trench and the inner cavity of the NFET trench and defines a central void in each trench. The integrated circuit is provided with a tungsten layer which fills the central voids of each trench to form metal gate structures.

BRIEF DESCRIPTION OF THE DRAWINGS

Embodiments of the integrated circuits having improved metal gate structures and methods for fabricating integrated circuits having improved metal gate structures will hereinafter be described in conjunction with the following drawing figures, wherein like numerals denote like elements, and wherein.

DETAILED DESCRIPTION

The following detailed description is merely exemplary in nature and is not intended to limit the integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits having improved metal gate structures and methods for fabricating integrated circuits having improved metal gate structures are provided. In an exemplary embodiment, the methods for fabricating integrated circuits include formation of a metal gate utilizing a single metal gate recessing step rather than the conventional process that utilizes two metal gate recessing steps. Specifically, conventional methods generally: (1) deposit (a) TiN barrier metal/P-type workfunction metal layer, (b) TaC N-type workfunction metal layer, and (c) TiN F-barrier layer in trenches; (2) form first recesses above layers a-c by performing a first recessing process of layers a-c; (3) fill the recesses with tungsten; (4) form second recesses above the tungsten by performing a second recessing process of the tungsten; and (5) fill the second recesses with nitride. Herein, the an exemplary embodiment of the method provides for: (1) depositing (a) TaC liner layer in the NFET trench, (b) WN F-barrier and seed (as well as P-type workfunction metal) layer, (c) tungsten; (2) forming first recesses above layers a-c by performing a first recessing process of layers a-c; and (3) filling the first recess with nitride. As a result of its simplified recess process and simplified recess chemistry, the current process provides more process margin.

FIGS. 1-5 illustrate sequentially a method for fabricating such integrated circuits in accordance with various embodiments herein. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

Figure 1:
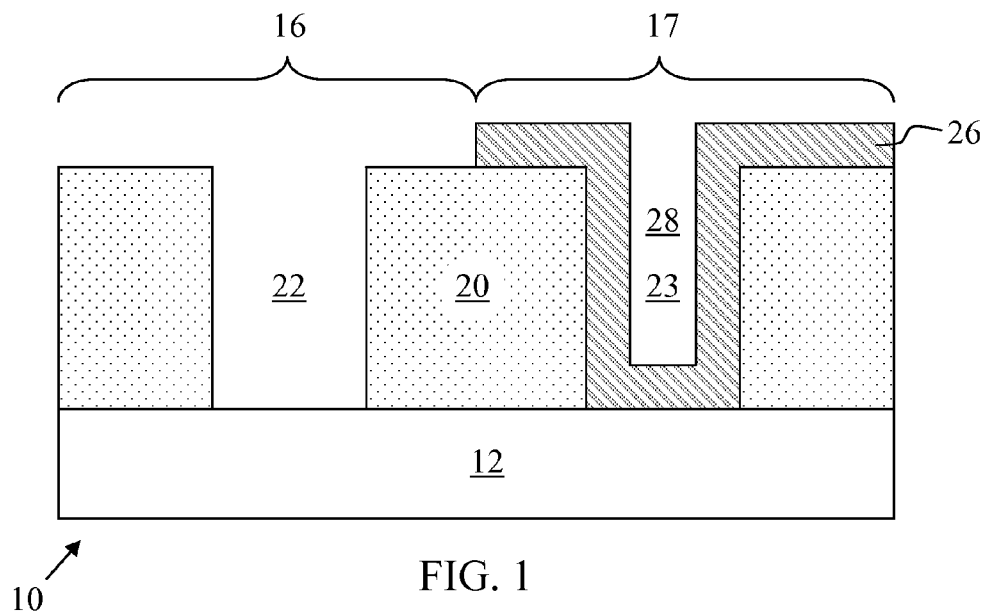
FIGS. 1-5 illustrate, in cross section, a portion of an integrated circuit and method steps for fabricating an integrated circuit in accordance with various embodiments herein.

Turning now to FIG. 1, in an exemplary embodiment, the process of fabricating an integrated circuit 10 begins by providing a semiconductor substrate 12 on which shallow trench isolation (STI) structures, source/drain regions, source/drain extension regions, gate dielectrics, contacts, spacers, dummy gate patterns, hard mask layers, and other features may be formed. The semiconductor substrate 12 is typically a silicon wafer and includes various doping configurations as is known in the art to define a P-channel field effect transistor (PFET) region 16 and a N-channel FET (NFET) region 17. The semiconductor substrate 12 may also include other elementary semiconductor materials such as germanium. Alternatively, the substrate 12 may include a compound semiconductor such as, silicon carbide, gallium arsenide, indium arsenide, or indium phosphide. Further, the substrate 12 may optionally include an epitaxial layer (epi layer), may be strained for performance enhancement, and/or may include a silicon-on-insulator (SOI) structure. As shown, an interlayer dielectric material 20 is formed on the semiconductor substrate 12 by chemical vapor deposition (CVD), high density plasma CVD, spin-on, sputtering, or other suitable methods. The interlayer dielectric material 20 may include silicon oxide, silicon oxynitride, or a low k material.

In FIG. 1, the interlayer dielectric 20 defines a PFET trench 22 and an NFET trench 23 in the respective regions 16, 17. Typically, the trenches 22, 23 may be formed by depositing the interlayer dielectric around dummy gate patterns previously formed on the semiconductor substrate 12, and then removing the dummy gate patterns. In order to form the metal gates structures contemplated herein, an N-type work function metal layer 26 is deposited overlying the interlayer dielectric 20 and in the trenches 22, 23. The N-type work function metal layer 26 may be formed from tantalum carbide (TaC), titanium aluminum (TiAl) or tantalum carbide aluminum (TaCAl). In an exemplary embodiment, the N-type work function metal layer 26 is deposited by CVD or by atomic layer deposition (ALD) to a thickness of more than about 20 Angstroms (Å), such as in an exemplary range of about 30 Å to about 60 Å. These deposition processes are conformal and provide for control of the deposition thickness. The N-type work function metal layer 26 partially fills the NFET trench 23 and defines an inner cavity 28 therein. After forming the N-type work function metal layer 26, an appropriate etch process is used to remove the N-type work function metal layer 26 from the PFET region 16. The status of the integrated circuit 10 is shown in FIG. 1 after the removal of the N-type work function metal layer 26 from the PFET region 16.

After etching the N-type work function metal layer 26 from the PFET region 16, a P-type work function metal layer 30 is deposited overlying the PFET and NFET regions 16, 17. The P-type work function metal layer 30 may be formed from tungsten nitride (WN) and be deposited by CVD or ALD to a thickness of from about 10 Å to about 70 Å, for example, to a thickness of about 30 Å. Again, these deposition processes provide for good conformality and controllability of deposition thickness. Tungsten nitride has a work function of about 4.9 eV. The P-type work function metal layer 30 also serves as a seed layer and barrier layer in the trenches 22 and 23 for CVD W deposition.

Figure 2:
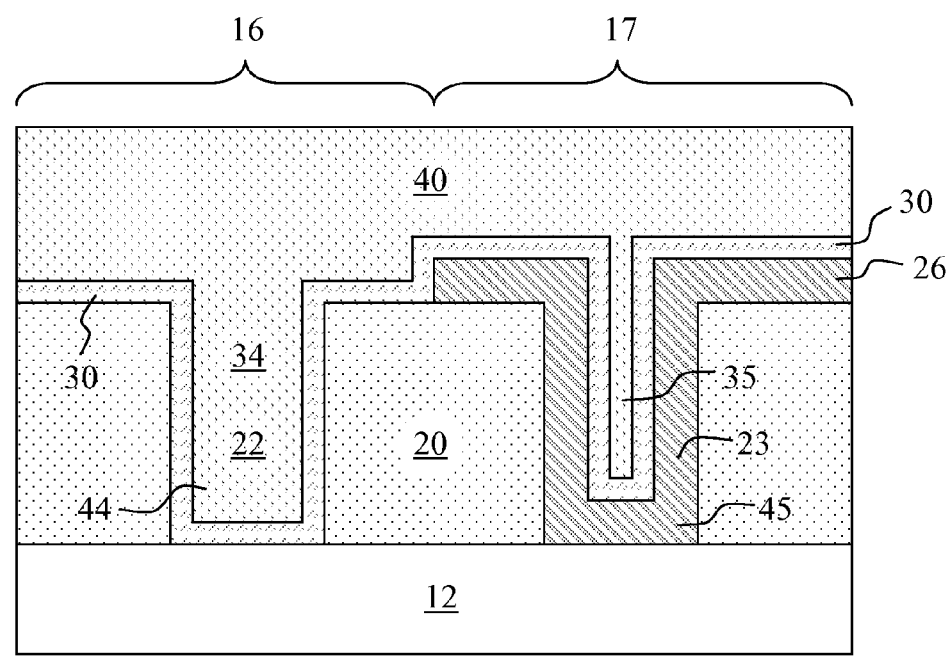

As shown in FIG. 2, the P-type work function metal layer 30 partially fills the PFET trench 22 and the inner cavity 28 in the NFET trench 23. As a result, the P-type work function metal layer 30 defines central voids 34, 35 in the respective trenches 22, 23. Further, the P-type work function metal layer 30 directly abuts the interlayer dielectric 20 in the PFET region 16 and the N-type work function metal layer 26 in the NFET region 17. Depending on when the gate insulator is formed, the P-type work function metal layer 30 may be deposited onto the gate insulator rather than directly on the interlayer dielectric 20. One process would form the gate insulator below the dummy gate. Then the metal gate would be deposited directly on the interlayer dielectric 20 after the dummy gate is removed. Another process would remove the dummy gate and a dummy gate insulator, deposit the real gate insulator over the interlayer dielectric 20 and lining the walls of the trench, and then deposit the metal gate structure.

After depositing the P-type work function metal layer 30, a metal fill 40 is deposited overlying both regions 16, 17. In an exemplary process, the metal fill 40 is deposited by CVD to a thickness of about 2000 Å to provide an overburden for later planarization by CMP. An exemplary metal fill 40 is tungsten. The metal fill 40 fills both central voids 34, 35 to form metal gate structures 44, 45. Tungsten is an exemplary metal fill 40 as CVD W is easily recessed for formation of self-aligned contacts. Further, W has good filling performance, especially at low temperatures, such as less than about 350° C., and can be deposited by CVD or PVD without suffering from void formation. Generally, void formation is determined by the profile of gate trench. If the gate trench is 90° or more, there is little chance that W will form a void. Further, the CVD W process utilizing tungsten hexafluoride (WF6) is fast, inexpensive, and a well known, proven technology.

Figure 3:
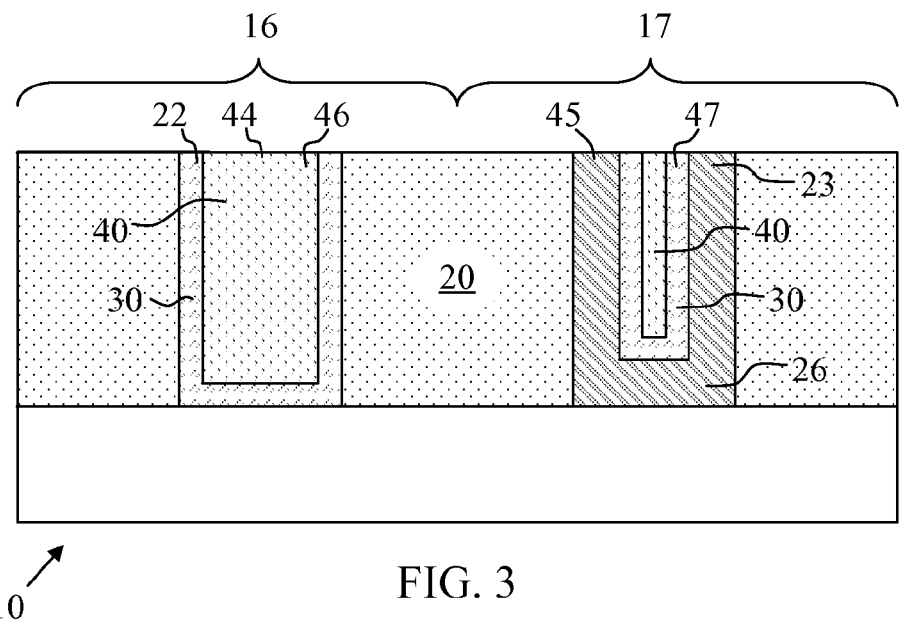
Figure 4:
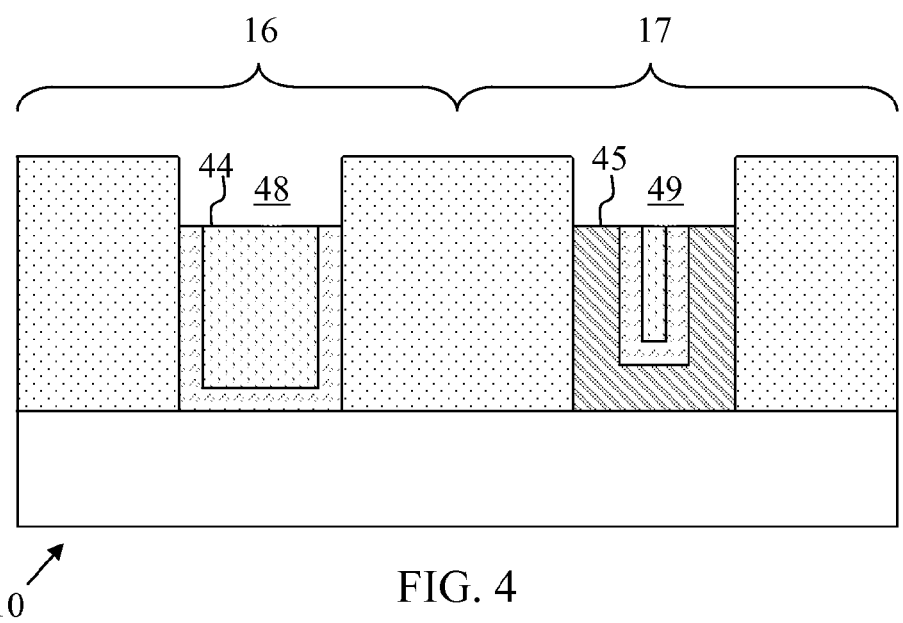
Figure 5:
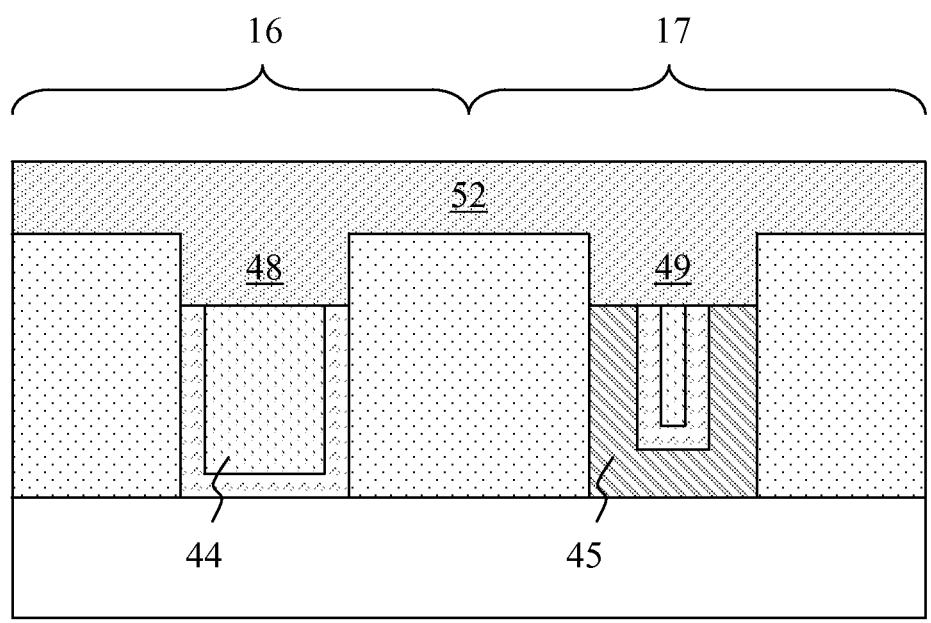

In FIG. 3, the metal gate structures 44, 45 are planarized to the interlayer dielectric 20 by a chemical mechanical polishing (CMP) process. The planarization process removes the N-type work function metal layer 26, the P-type work function metal layer 30, and the metal fill 40 that are deposited outside of the trenches 22, 23. Then, portions 46, 47 of the metal gate structures 44, 45 are recessed to form recesses 48, 49 as shown in FIG. 4. Thereafter, an insulating layer 52, such as silicon nitride, is deposited in the recesses 48, 49 in the regions 16, 17 to insulate the metal gate structures 44, 45 as illustrated in FIG. 5.

In various embodiments, the method may continue to include process steps such as deposition or formation of passivation layers, contacts, interconnect structures (e.g., lines and vias, metal layers, and interlayer dielectric material to provide electrical interconnection to the device including the formed metal gate structures 44, 45.

In summary, an integrated circuit fabrication process is implemented to form improved metal gate structures. Problems with convention processes for forming metal gate structures may be reduced through the use of selected P-type and N-type work function metal layers and selected metal fill materials that enable the use of selected deposition or formation processes. Specifically, the use of a W metal fill and WN P-type workfunction metal along with an N-type workfunction metal, for example TaC overcomes issues of the conventional methods by reducing the number of steps, number of layers, and layer thicknesses in metal gate formation.

To briefly summarize, the fabrication methods described herein result in integrated circuits having metal gate structures with improved performance. While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
   forming a PFET trench in a PFET region and an NFET trench in an NFET region of an interlayer dielectric material on a semiconductor surface;
   partially filling the NFET trench with an N-type work function metal layer to define an inner cavity;
   partially filling the PFET trench and the inner cavity in the NFET trench with a P-type work function metal layer to define a central void in each trench;
   filling the central voids with a metal fill to form metal gate structures; and
   performing a single recessing process to recess portions of each metal gate structure within each trench to form a recessed surface in each trench, wherein each recessed surface is an upper surface of a respective metal gate structure.

2. The method of claim 1 wherein performing a single recessing process to recess portions of each metal gate structure within each trench comprises recessing portions of the metal fill, the N-type work function metal layer, and the P-type work function metal layer in the NFET trench and recessing portions of the metal fill and the P-type work function metal layer in the PFET trench.

3. The method of claim 2 wherein the metal fill is tungsten, wherein filling the central voids comprises depositing the tungsten overlying the PFET and NFET regions by chemical vapor deposition (CVD) and wherein partially filling the PFET trench and the inner cavity in the NFET trench comprises partially filling the PFET trench and the inner cavity in the NFET trench with tungsten nitride.

4. The method of claim 1 further comprising planarizing the metal gate structures to the interlayer dielectric material before recessing, wherein planarizing the metal gate structure in the NFET trench comprises planarizing the N-type work function metal layer, the P-type work function metal layer, and the metal fill, and wherein planarizing the metal gate structure in the PFET trench comprises planarizing the P-type work function metal layer and the metal fill.

5. The method of claim 4 further comprising depositing an insulator over the interlayer dielectric material and over each recessed surface.

6. The method of claim 1 wherein partially filling the NFET trench comprises depositing TiAl, or TaCAl overlying the interlayer dielectric and along a bottom surface and sidewalls in the PFET trench and in the NFET trench, and wherein the method further comprises etching the N-type work function metal layer from the PFET trench and PFET region.

7. The method of claim 1 wherein partially filling the NFET trench with an N-type work function metal layer comprises:
   depositing an N-type work function metal layer comprising TaC, TiAl, or TaCAl overlying the interlayer dielectric and along a bottom surface and sidewalls in the PFET trench and NFET trench; and
   etching the N-type work function metal layer from the PFET trench and PFET region.

8. The method of claim 1 wherein partially filling the PFET trench and the inner cavity in the NFET trench comprises depositing the P-type work function metal layer in the PFET trench and overlying the interlayer dielectric material in the PFET region and the N-type work function metal layer in the NFET region, wherein the N-type work function metal layer separates the P-type work function metal layer from trench sidewalls in the NFET trench.

9. The method of claim 8 wherein partially filling the PFET trench and the inner cavity in the NFET trench comprises depositing tungsten nitride in the PFET trench and overlying the interlayer dielectric material in the PFET region and the N-type work function metal layer in the NFET region.

10. A method for fabricating an integrated circuit, the method comprising:
    forming a trench in an interlayer dielectric material on a semiconductor surface;
    depositing an N-type work function metal layer over the interlayer dielectric material adjacent the trench and partially filling the trench with the N-type work function metal layer to define an inner cavity;
    depositing tungsten nitride over the N-type work function metal layer adjacent the trench and partially filling the inner cavity to define a central void;
    depositing tungsten over the tungsten nitride adjacent the trench and filling the central void to form a metal gate structure;
    planarizing the N-type work function metal, the tungsten nitride, and the tungsten to a surface aligned with the interlayer dielectric material; and
    recessing the N-type work function metal, the tungsten nitride, and the tungsten during a single recessing process to form a recess over the N-type work function metal, the tungsten nitride, and the tungsten in the trench.

11. The method of claim 10 wherein depositing tungsten nitride comprises depositing a layer of tungsten overlying the interlayer dielectric material and in the central void by chemical vapor deposition (CVD).

12. The method of claim 10 wherein recessing the N-type work function metal, the tungsten nitride, and the tungsten during a single recessing process forms a recessed surface in the trench, wherein the recessed surface is an upper surface of the metal gate structure.

13. The method of claim 10 wherein forming a trench comprises forming trench sidewalls and a bottom surface in the interlayer dielectric material, and wherein depositing an N-type work function metal layer over the interlayer dielectric material and partially filling the trench with the N-type work function metal layer comprises forming the N-type work function metal layer on the bottom surface and trench sidewalls.

14. The method of claim 10 further comprising depositing an insulator over the interlayer dielectric material and in the recess.

15. The method of claim 10 wherein depositing an N-type work function metal layer over the interlayer dielectric material adjacent the trench and partially filling the trench with the N-type work function metal layer comprises depositing tantalum carbide aluminum (TaCAl) over the interlayer dielectric material adjacent the trench and partially filling the trench.

16. The method of claim 10 wherein depositing an N-type work function metal layer over the interlayer dielectric material adjacent the trench and partially filling the trench with the N-type work function metal layer comprises depositing tantalum carbide aluminum (TaCAl) over the interlayer dielectric material adjacent the trench and partially filling the trench.

17. A method for fabricating an integrated circuit, the method comprising:

forming a PFET trench in a PFET region and an NFET trench in an NFET region of an interlayer dielectric material on a semiconductor surface, wherein a region of interlayer dielectric material separates the PFET trench from the NFET trench;

partially filling the NFET trench with an N-type work function metal layer to define an inner cavity;

partially filling the PFET trench and the inner cavity in the NFET trench with a P-type work function metal layer to define a central void in each trench;

filling the central voids with a metal fill; and performing a single recessing process to recess portions of the metal fill, the N-type work function metal layer, and the P-type work function metal layer in the NFET trench and portions of the metal fill and the P-type work function metal layer in the PFET trench to form a recess in each trench.

18. The method of claim 17 further comprising planarizing the N-type work function metal layer, the P-type work function metal layer, and the metal fill to a surface aligned with the interlayer dielectric material.

19. The method of claim 17 wherein performing a single recessing process to recess portions of the metal fill, the N-type work function metal layer, and the P-type work function metal layer in the NFET trench and portions of the metal fill and the P-type work function metal layer in the PFET trench comprises:

forming a recessed surface in the NFET trench over and bounding the metal fill, the P-type work function metal layer, and the N-type work function metal layer; and forming a recessed surface in the PFET trench over and bounding the metal fill and the P-type work function metal layer.

20. The method of claim 17 wherein performing a single recessing process comprises establishing an NFET metal gate structure in the NFET trench and establishing a PFET metal gate structure in the PFET trench, wherein the metal gate structures are separated by the region of interlayer dielectric material.

* * * * *